United States Patent

Ogata et al.

[11] Patent Number: 6,159,322
[45] Date of Patent: Dec. 12, 2000

[54] PHOTOSENSITIVE CERAMIC GREEN SHEET, CERAMIC PACKAGE, AND PROCESS FOR PRODUCING THE SAME

[75] Inventors: Tomohiko Ogata; Takaki Masaki; Yuichiro Iguchi; Tuyosi Tanaka; Keiji Iwanaga, all of Shiga-ken, Japan

[73] Assignee: Toray Industries, Inc., Tokyo, Japan

[21] Appl. No.: 09/011,874

[22] PCT Filed: Jun. 17, 1996

[86] PCT No.: PCT/JP96/01658

§ 371 Date: Feb. 17, 1998

§ 102(e) Date: Feb. 17, 1998

[87] PCT Pub. No.: WO97/48658

PCT Pub. Date: Dec. 24, 1997

[51] Int. Cl.[7] .......................... B32B 31/00; B32B 18/00; B05D 5/12; H05K 1/00
[52] U.S. Cl. ...................... 156/230; 156/252; 156/275.5; 427/96; 427/126.2; 427/269; 428/210; 428/901
[58] Field of Search .................. 156/89.16, 230, 156/233, 252, 272.2, 275.5, 278; 257/700, 703; 428/901, 210; 427/269, 96, 126.2

[56] References Cited

U.S. PATENT DOCUMENTS 6,004,705  12/1999  Masaki et al. .

FOREIGN PATENT DOCUMENTS

| 0 602 252 A1 | 1/1994 | European Pat. Off. . |
|---|---|---|
| 0 589 241 A2 | 3/1994 | European Pat. Off. . |
| 2-190308 | 7/1990 | Japan . |
| 2-204356 | 8/1990 | Japan . |
| 4-139733 | 5/1992 | Japan . |
| 5-114531 | 5/1993 | Japan . |
| 5-170517 | 7/1993 | Japan . |
| 5-204151 | 8/1993 | Japan . |
| 5-311097 | 11/1993 | Japan . |
| 6-024824 | 2/1994 | Japan . |
| 6-251621 | 9/1994 | Japan . |
| 6-305814 | 11/1994 | Japan . |
| 7-135386 | 5/1995 | Japan . |
| 94/01377 | 1/1994 | WIPO . |

OTHER PUBLICATIONS

Database WPI Section CH, Week 9212 Derwent Publications Ltd., London, GB; Class A14, AN 92–091972 XP 002114340.
JP 04 034808 A (NGK Insulators LTD), Feb. 5, 1992 (Feb. 5, 1992) *Abstract*.
Patent Abstracts Of Japan vol. 015, No. 434 (E–1129), Nov. 6, 1991 (Nov. 6, 1991).
JP 03 180092 A (Hitachi LTD; Others: 01), Aug. 6, 1991 (Aug. 6, 1991) *Abstract*.

*Primary Examiner*—Curtis Mayes
*Attorney, Agent, or Firm*—Morrison & Foerster, LLP

[57] ABSTRACT

A photosensitive ceramic green sheet having an inorganic powder including 30% or more of a glass powder and a photosensitive organic component as essential components, characterized by satisfying $-0.05 \leq N2-N1 \leq 0.1$ where N1 is the average refractive index of the organic component and N2 is the average refractive index of the inorganic powder is used to provide a highly accurate ceramic package with a high aspect ratio.

40 Claims, No Drawings

1 …

PHOTOSENSITIVE CERAMIC GREEN SHEET, CERAMIC PACKAGE, AND PROCESS FOR PRODUCING THE SAME

TECHNICAL FIELD

The present invention relates to a new photosensitive ceramic green sheet, a method for forming through holes in a ceramic green sheet, a method for forming a circuit wiring pattern on a ceramic green sheet, and a ceramic package. The photosensitive ceramic green sheet of the present invention can be suitably used for a fired ceramic substrate on which is to be mounted semiconductor devices at a high density, particularly a multi-layer fired ceramic board, and is effective for forming a fine circuit pattern of electrodes for the surface layer and inner layer of a board.

BACKGROUND ART

In recent years, such systems as computers and communication apparatuses are being downsized and destined to have improved properties, and in this connection, it is desired to improve the technique for forming via holes and through holes (hereinafter simply called through holes) in a ceramic board on which is to be mounted semiconductor devices.

Especially the ceramic green sheet used for CPU, etc. of computer is desired to be higher in accuracy and to be made of a material which allows through holes with a high aspect ratio to be formed.

Multi-layer ceramic boards are generally produced by either the thick film printing lamination method or the green sheet method. The green sheet method can be further classified into the lamination method and the printing method. In the green sheet printing method, a conductive paste and an insulating paste are printed on a green sheet repetitively alternately for lamination, to form a multi-layer board, and after repeated printing and drying, firing is effected only once for completion. The green sheet lamination method is almost similar to the green sheet printing method, but when a multi-layer board is made, each time a conductor is printed is followed by thermocompression bonding and firing. The green sheet lamination method has such disadvantages in that fine through holes cannot be formed at the same time and that many jigs and pieces of equipment must be used. Semiconductor packaging requires techniques for precisely processing ceramic boards, and in the present situation where through holes are formed by mechanical methods such as mold pressing and NC punching and where patterns are formed by screen printing, any new technique to meet the demand for higher precision patterning suitable for smaller circuit materials is required.

As methods to improve these problems, Japanese Patent Laid-Open (Kokai) Nos. 1-183456 and 6-202323 propose the formation of through holes by photolithography using a photosensitive ceramic green sheet. However, since the photosensitive ceramic green sheet is low in sensitivity and resolution, the method has a disadvantage in that through holes with a high aspect ratio, for example, 100 μm or less through holes cannot be formed accurately or uniformly on a thick sheet with a thickness of more than 50 μm.

Furthermore, as a method for forming a circuit wiring pattern on a substrate, screen printing using a paste consisting of a metallic powder and an organic binder has been often used. However, screen printing has a disadvantage in that a highly accurate pattern cannot be formed.

Japanese Patent Laid-Open (Kokai) Nos. 5-204151 and 5-342992 propose methods for forming a pattern by lithography using a photosensitive paste. However, since the photosensitive paste is low in sensitivity and resolution, high accuracy cannot be achieved, and for example, the limit of lines and spaces is 80/80 μm. Japanese Patent Laid-Open (Kokai) No. 4-139733 describes a method for forming a pattern on a film using an ultraviolet light setting resin. In this method, a pasty mixture consisting of a conductive powder mainly composed of one or more high melting point metals selected from W and Mo and a binder mainly composed of an ultraviolet light setting resin is formed as a layer on a film substrate of a flexible resin, etc. using a doctor blade, etc., and the mixture layer is irradiated with ultraviolet light through a photo mask, to harden the binder, for removing the non-irradiated portions. Furthermore, the obtained transfer film is placed on a ceramic green sheet on the conductive pattern side, and the conductive pattern is transferred onto the ceramic green sheet. Finally, the film is removed.

This so-called transfer method allows defects to be found when the pattern has been formed on the film, and can be expected to have an effect of decreasing the failure ratio to improve the yield. However, actual transfer involves many problems, namely how to align the film with a pattern formed on it and the sheet or-substrate on which the pattern is to be transferred, how to maintain the form stability of the film and how to ensure the releasability of the pattern. Furthermore, as in ordinary photolithography, high accuracy cannot be achieved because of the low sensitivity and resolution of the photosensitive paste.

DISCLOSURE OF THE INVENTION

The object of the present invention is to provide a photosensitive ceramic green sheet allowing highly accurate through holes with a high aspect ratio to be formed by photolithography, a method for forming through holes, and a method for forming a fine circuit wiring pattern on a ceramic green sheet.

The object of the present invention can be achieved by a photosensitive ceramic green sheet, which contains an inorganic powder and a photosensitive organic component as essential components, characterized by satisfying the following formula:

$$-0.05 \leq N2-N1 \leq 0.2$$

where N1 is the average refractive index of the organic component and N2 is the average refractive index of the inorganic powder.

The object of the present invention can also be achieved by a photosensitive ceramic green sheet, which contains an inorganic powder and a photosensitive organic component as essential components, characterized by using an inorganic powder with an average refractive index of 1.5 to 1.8 as said inorganic powder.

BEST MODE FOR CARRYING OUT THE INVENTION

The present invention relates to a photosensitive ceramic green sheet characterized by having highly accurate through holes with a high aspect ratio formed by controlling the refractive index of the organic component in the photosensitive ceramic green sheet, to reduce the reflection and scattering at the interfaces with the inorganic component, a method for forming a fine through hole pattern, and a method for forming a pattern on a ceramic green sheet using a photosensitive conductive paste.

The present invention is described below to clarify the constitution of the photosensitive ceramic green sheet, the constitution of the photosensitive conductive paste, the method for producing the sheet, the method for producing the paste, the method for forming through holes and the method for forming a pattern, in this order.

The photosensitive ceramic green sheet of the present invention contains an inorganic powder and a photosensitive organic component as essential components.

The inorganic powder is a powder of a glass or metal (gold, platinum, silver, copper, nickel, aluminum, palladium, tungsten, ruthenium oxide, etc.) used generally for electronic materials. The powders especially useful in the present invention are a ceramic powder and a glass powder.

The inventors found that if isometric grains or spherical grains are used as the inorganic powder, through holes with a high aspect ratio can be formed. It is preferable to use an inorganic powder with a spherical grain content of 80% by number.

The inorganic powder suitably used in this case is 1 to 7 $\mu$m in the (average) grain size of 50 wt % of it, 0.4 to 1 $\mu$m in the grain size of 10 wt %, 2 to 10 $\mu$m in the grain size of 90 wt %, and 0.2 to 3 m/g in specific surface area.

The material which can be used as the ceramic powder can be at least one selected from a group consisting of alumina, zirconia, magnesia, berylia, mullite, cordierite, spinel, forsterite, anorthite, celsian, silica and aluminum nitride. Alumina, cordierite and silica are especially preferable.

In the case of a mixture of a glass powder and a ceramic powder, it is preferable to use the glass powder in an amount of 30 wt % or more. It is more preferable to use in an amount of 50 wt % or more. The glass powder is not especially limited as far as it is a general glass powder, but a glass powder with excellent processability and long pot life is preferable. A powder of spherical grains has advantages such that that the packing density is high to provide a dense sintered compact and that since the surface area is small, the light scattering at the time of exposure can be decreased. It is desirable to use a glass powder with an average refractive index of 1.5 to 1.65.

It is preferable that the glass powder contains 15 to 70 wt % of $SiO_2$. If the $SiO_2$ content is less than 15 wt %, the denseness, strength and stability of the glass layer decline, and the glass layer does not match with the silicon used in the semiconductor devices in the coefficient of thermal expansion, to cause deviation from desired values. An SiO2 content of 70 wt % or less has an advantage in that the thermal softening point declines to allow firing at lower than 1000° C. It is desirable that the $Al_2O_3$ content is 10 to 60 wt %. If the $Al_2O_3$ content is less than 10%, it is difficult to provide a fired substrate having a sufficient strength, and if more than 60%, the dielectric constant of the board becomes too high. If $B_2O_3$ is contained in an amount of 4 to 20 wt %, electric, mechanical and thermal properties such as electric insulation, strength, coefficient of thermal expansion and denseness of the insulation layer can be improved.

It is especially desirable that the photosensitive ceramic green sheet is composed of 30 wt % or more of a glass powder consisting, as oxides, of 15 to 70 parts by weight of $SiO_2$ 10 to 60 parts by weight of $AL_2O_3$ 4 to 20 parts by weight of $B_2O_3$ 1 to 25 parts by weight of MgO 1 to 10 parts by weight of $TiO_2$ and 1 to 25 parts by weight of at least one compound selected from a group consisting of $Li_2O$, $Na_2O$, K2O, BaO, CaO and PbO, and 70 wt % or less of a ceramic powder of at least one material selected from a group consisting of alumina, zirconia, magnesia, berylia, mullite, cordierite, spinel, forsterite, anorthite, celsian, silica and aluminum nitride.

The glass powder can also contain metal oxides such as $ZrO_2$, SnO, ZnO and $Y_2O_3$ additionally, but it is preferable that their amount is 5 wt % or less. If the amount of these ingredients is too large, hygroscopicity becomes high to raise the viscosities of the paste and slurry.

The photosensitive organic component used in the present invention refers to an organic component containing a photosensitive compound in the ceramic green sheet (the portion remaining after removing the inorganic component from the ceramic green sheet), It is preferable that the inorganic powder has a refractive index of 1.5 to 1.8. Generally, an inorganic powder has a refractive index of about 1.5 to 2.5. If the average refractive index of the organic component is greatly different from the average refractive index of the inorganic powder, the reflectance and scattering at the interfaces between the inorganic powder and the photosensitive organic component become large, not allowing a precise pattern to be obtained. The refractive index of a general organic component is 1.45 to 1.7. So, if the average refractive index of the inorganic powder is kept in a range from 1.5 to 1.8, the inorganic powder can match with the organic component in refractive index. It is more preferable to use an inorganic powder with a refractive index of 1.54 to 1.8, especially 1.56 to 1.78, since the reflection and scattering is at the interfaces between the inorganic powder and the photosensitive organic compound can be decreased, and since highly accurate through holes with a high aspect ratio can be formed.

In this case, the difference between the photosensitive organic compound and the inorganic powder in refractive index is important. If the average refractive index N1 of the organic component and the average refractive index N2 of the inorganic powder satisfy the following formula, the reflection and scattering at the interfaces can be decreased, and a pattern with a higher aspect ratio can be obtained.

$$-0.05 \leq N2-N1 \leq 0.2$$

A more preferable range is $$-0.05 \leq N2-N1 \leq 0.1.$$

In the present invention, the refractive index can be accurately measured at the wavelength of the ultraviolet light used for irradiating the formed photosensitive ceramic green sheet It is especially preferable to use light with an optional wavelength in a range of 350 to 480 nm for measurement. It is more preferable to measure the refractive index at i-line (365 nm) or g-line (436 nm).

The photosensitive organic component contains at least one photosensitive compound selected from photosensitive monomers, photosensitive oligomers and photosensitive polymers, and as required, further contains such additives as a binder, photo polymerization initiator, ultraviolet light absorber, sensitizer, sensitizing aid, polymerization inhibitor, plasticizer, thickener, organic solvent, antioxidant, dispersing agent, organic or inorganic precipitation preventive and leveling agent.

It is preferable that the paste contains 5 to 50 wt % of the photosensitive organic component. A more preferable range is 5 to 30 wt %. When sheets respectively with a pattern formed are laminated, an air layer is likely to be formed between the respectively adjacent sheets, and if the sheets ate less flexible or not air-permeable, air cannot escape from the interface between the sheets. In this case, at the time of firing, then disadvantageously the air trapped between the sheets is expanded to delaminate the sheets. To improve the flexibility of the sheets, it is desirable that the organic component content of the sheets is larger, but if too large, the organic component perfectly fills the clearances formed in the inorganic powder, to lower air permeability. Furthermore, the shrinkage caused by fixing becomes large to greatly deform the sheets. So, for lamination, it is important that the sheets have both flexibility and air permeability, The reactive ingredient contained in the organic component can be either of a photo desolubilizing type and photo solubilizing type. Photo desolubilizing components include:

(1) Functional monomers, oligomers and polymers with one or more unsaturated group, etc. in the molecule
(2) Those containing a photosensitive compound such as an aromatic diazo compound, aromatic azide compound or organic halogen compound, etc.
(3) So-called diazo resins such as condensation products of a diazo based amine and formaldehyde.

The photo solubilizing components include:

(4) Those containing an inorganic salt of a diazo compound, a complex with an organic acid or a quinonediazo
(5) Those with a quinonediazo combined with a proper polymer binder, such as the naphthoquinone-1,2-diazido-5-sulfonic acid ester of phenol or a novolak resin.

As the reactive ingredient used in the present invention, all of the above can be used. However, a preferable photosensitive component which can be simply used as a mixture with an inorganic powder for a photosensitive paste is any one of (1).

The photosensitive monomers are compounds with a carbon—carbon unsaturated bond, for example, methyl acrylate, ethyl acrylate, n-propyl acrylate, isopropyl acrylate, n-butyl acrylate, sec-butyl acrylate, iso-butyl acrylate, tert-butyl acrylate, n-pentyl acrylate, allyl acrylate, benzyl acrylate, butoxyethyl acrylate, butoxytriethylene glycol acrylate, cyclohexyl acrylate, dicyclopentanyl acrylate, dicyclopentenyl acrylate, 2-ethhylhexyl acrylate, glycerol acrylate, glycidyl acrylate, heptadecafluorodecyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acylate, methoxydiethylene glycol acrylate, octafluoropentyl acrylate, phenoxyethyl acrylate, stearyl acrylate, trifluoroethyl acrylate, allylated cyclohexyl diacrylate, 1,4-butanediol diacrylate, 1,3-butylene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentylglycol diacrylate, propylene glycol diacrylate, polypropylene glycol diacrylate, triglycerol diacrylate, trimethylolpropane triacrylate, acrylaride, aminoethyl acrylate, phenyl acrylate, phenoxyethyl acrylate, benzyl acrylate, 1-naphthyl acrylate, 2-naphthyl acylate, bisphenol A diacrylate, diacrylate of bisphenol A—ethylene oxide addition product, diacrylate of bisphenol A—propylene oxide addition product, thiophenol acrylate, benzylmercaptan acrylate, monomers in which one to five hydrocarbon atoms of the aromatic ring of any of these compounds are substituted by chlorine or bromine atoms, styrene, p-methylstyrene, o-methylstyrene, m-methylstyrene, chlorinated styrene, brominated styrene, α-methylstyrene, chlorinated α-methylstyrene, brominated α-methylstyrene, chloromethylstyrene, hydroxymethylstyrene, carboxymethylstyrene, vinylnaphthalene, vinylanthracene, vinylcarbazole, those in which the acrylates in the molecule of any of the above compounds are partially or wholly substituted by methacrylates, γ-methacryloxypropyltrimethoxysilane, 1-vinyl-2-pyrrolidone, etc. In the present invention, one or more of them can be used.

In addition to the above, an unsaturated acid such as an unsaturated carboxylic acid can be added to improve the developability after exposure. The unsaturated carboxylic acids which can be used here include, for example, acrylic acid, methacrylic acid, itaconic acid, crotonic acid, maleic acid, fumaric acid, vinylacetic acid and their acid anhydrides, etc.

In general, the refractive index of an organic component is 1.45 to 1.7, but the average refractive index of an inorganic powder is mostly larger than it. So, for matching them in refractive index, it is preferable to use a photosensitive organic component with a refractive index of 1.5 to 1.75. A more preferable range is 1.52 to 1.7. If a photosensitive organic compound with the refractive index in this range is used, the photosensitive ceramic green sheet allows more highly accurate through holes with a higher aspect ratio to be formed.

In this case, an ingredient with a high refractive index is introduced into the organic component. It is effective for enhancing the refractive index to use 10 wt % or more of a compound with a group selected from a group consisting of sulfur atom, bromine atom, iodine atom, naphthalene ring, biphenyl ring, anthracene ring and carbazole ring, in the organic component. Furthermore, even by including a compound with a benzene ring in an amount of 20 wt % or more, the refractive index can be enhanced.

Especially by including a compound with a sulfur atom or naphthalene ring in an amount of 10 wt % or more, the refractive index of the organic component can be more simply enhanced. However, if the content is more than 60 wt %, the photosensitivity declines. So, it is preferable that the total content of the compounds with a sulfur atom and a naphthalene ring is 60 wt % or less. The monomers containing a sulfur atom in the molecule include compounds represented by the following general formulae (a), (b) and (c).

(a)

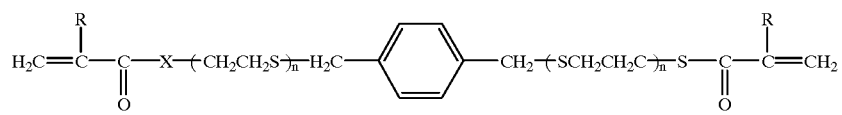

(b)
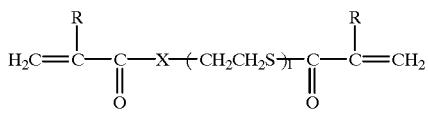

(c)
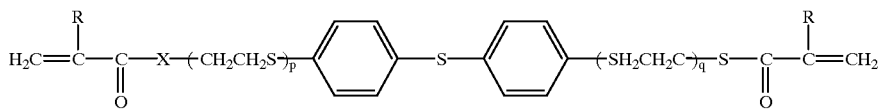

In the structural formulae, R stands for a hydrogen atom or methyl group; X stands for S or O; l stands for an integer of 1 to 3; and m, n, p and q stand for, respectively independently, an integer of 0 to 3.

If the content of the group selected from a group consisting of sulfur atom bromine atom, iodine atom, benzene ring, naphthalene ring, bisphenyl ring, anthracene ring and carbazole ring is 5 wt % or more in the photosensitive organic component, the photosensitive ceramic green sheet obtained allows highly accurate through holes with is a high aspect ratio to be formed.

On the other hand, the photosensitive oligomer or photosensitive polymer can be an oligomer or polymer with a weight average molecular weight of 500 to 100,000 obtained by polymerizing at least one of the above compounds with a carbon—carbon unsaturated bond. In the polymerization, another reactive monomer can be copolymerized in such a manner that the content of any of those monomers may be 10 wt % or more. Preferable is 35 wt % or more. To enhance the refractive index, it is possible to use an oligomer or polymer containing 10 wt % or more, preferably 35 wt % or more of a methacrylate monomer or acrylate monomer with an aromatic ring such as a benzene ring or naphthalene ring, for example, at least one selected from a group consisting of phenyl (meth)acrylate, phenoxyethyl (meth)acrylate, benzyl (meth)acrylate, 1-naphthyl (meth)acrylate, 2-naphthyl (meth)acrylate, bisphenol A di(meth)acrylate, di(meth) acrylate of bisphenol A—ethylene oxide addition product, di(meth)acrylate of bisphenol A—propylene oxide addition product, thiophenol (meth)acrylate, benzylmercaptan (meth) acrylate, monomers in which one to five hydrogen atoms of the aromatic ring of any of these (meth)acrylates are substituted by chorine or bromine atoms, compounds represented by said general formula (a), (b) and (c), styrene, p-methylstyrene, o-methylstyrene, m-methylstyrene, chlorinated styrene, brominated styrene, α-methylstyrene, chlorinated α-methylstyrene, brominated α-methylstyrene, chlorostyrene and hydroxymethylstyrene.

Furthermore, if an unsaturated carboxylic acid is copolymerized, the developability after exposure can be improved. The unsaturated carboxylic acids which can be used here include, for example, acrylic acid, methacrylic acid, itaconic acid, crotonic acid, maleic acid, fumaric acid, vinylacetic acid and their acid anhydrides.

It is preferable that the acid value (AV) of the polymer or oligomer with carboxyl groups at the side chains thus obtained is 50 to 180, especially 70 to 140. If the acid value is less than 50, the development allowance becomes narrow. If the acid value exceeds 180, the solubility of the non-exposed portions in the developer declines, and if the developer concentration is raised to make up for the decline, the exposed portions, too, are solubilized, making it difficult to obtain highly accurate through holes.

If photoreactive groups are added to the side chains or molecular ends of any of the polymers and oligomers enumerated above, the polymer or oligomer can, be made photosensitive. Preferable photoreactive groups are ethylenic unsaturated groups which include vinyl groups, allyl groups, acrylic groups, methacrylic groups, etc.

Such side chains can be added to the oligomer or polymer, for example, by letting an ethylenic unsaturated compound with an glycidyl group or isocyanato group, acrylic acid chloride, methacrylic acid chloride or allyl chloride addition-react with the mercapto groups, amino groups, hydroxyl groups or carboxyl groups in the polymer.

The ethylenic unsaturated compound with a glycidyl group can be selected from glycidyl acrylate, glycidyl methacrylate, allyl glycidyl ether, glycidyl ethylacrylate, crotonyl glycidyl ether, glycidyl crotonate ether, glycidyl isocrotonate ether, etc.

The ethylenic unsaturated compound with an isocyanato group can be selected from (meth)acryloyl isocyanate, (meth)acryloylethyl isocyanate, etc. It is preferable that the ethylenic unsaturated compound with a glycidy group or isocyanato group, acrylic acid chloride, methacrylic acid chloride or allyl chloride is added in an amount of 0.05 to 1 mole equivalent for each equivalent of the mercapto groups, amino groups, hydroxyl groups or carboxyl groups in the polymer.

The binders which can be used here include polyvinyl alcohol, polyvinyl butyral, methacrylate polymers, acrylate polymers, acrylate - methacrylate copolymers, α-methylstyrene polymer, butyl methacrylate resin, etc. Enhancing the refractive index of the binder is also effective for enhancing the refractive index of the photosensitive organic component. For enhancing the refractive index of the binder, said photosensitive polymers and photosensitive oligomers which do not have the ethylenic unsaturated groups as photoreactive groups added at the side chains or molecular ends can be used. That is, the photosensitive polymers and photosensitive oligomers not processed to have the reactive groups added can be used as binders.

The photo polymerization initiators which can be used here include, for example, benzophenone, methyl o-benzoylbenzoate, 4,4-bis(dimethylamno)benzophenone, 4,4-bis(diethylamino)benzophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenyl-2-phenylacetophenone, 2-hydroxy-2-methylpropiophenone, p-t-butyldichloroacetophenone, thioxanthone, 2-methylthioxanthone, 2-chiorothioxanthone, 2-isopropylthioxanthone, diethylthioxanthone, benzil, benzyl dimethyl ketal, benzyl methoxyethyl acetal, benzoin, benzoin methyl ether, benzoin butyl ether, anthraquinone, 2-t-butylanthraquinone, 2-amylanthraquinone, β-chloroanthraquinone, anthorone, benzanthrone, dibenzosuberone, methyleneanthrone, 4-azidobenzalacetophenone, 2,6-bis(p-azidobenzylidene)

cyclohexanone, 2,6-bis(p-azidobenzylidene)-4-methylcyclohexanone, 2-phenyl-1,2butadione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)pbenyl]-2-morpholino-1-propanone, naphthalenesulfonyl chloride, quinolinesulfonyl chloride, N-phenylthioacridone, 4,4-azobisisobutyronitrile, diphenyl disulfide, benzthiazole disulfide, triphenylphosphine, camphorquinone, carbon tetrabromide, tribromophenylsulfone, benzoin peroxide, and combinations of a photoreducing dye such as Eosine or Methylene Blue and a reducing agent such as ascorbic acid or triethanolamine. In the present invention, one or more of them can be used. The photo polymerization initiator is added in an amount of 0.05 to 10 wt % based on the weight of the reactive component. A more preferable range is 0.1 to 5 wt %. If the amount of the photo polymerization initiator is too small, photosensitivity becomes poor, and if the amount of the photo polymerization initiator is too large, the remaining proportion of exposed portions may be too small.

It is also effective to add an ultraviolet light absorber which is an organic dye. If a light absorber high in the effect of absorbing ultraviolet light is added, a high aspect ratio, high accuracy and high resolution can be obtained. It is preferable that the ultraviolet light absorber used is an organic dye, especially an organic dye with a high ultraviolet light absorption coefficient in a wavelength range of 350 to 450 nm. The organic dyes which can be used here include azo dyes, aminoketone dyes, xanthene dyes quioline dyes, anthraquinone dyes, benzophenone dyes, diphenylcyanoacrylate dyes, triazine dyes and p-aminobenzoic acid dyes. Even if an organic dye is added as a light absorber, preferably it does not remain in the insulation film after completion of firing, to decrease the degradation of insulation film properties by the otherwise remaining light absorber. Among the organic dyes, azo dyes and benzophenone dyes are preferable. It is preferable that the amount of the organic dye is 0.05 to 5 wt %. If is the amount is less than 0.05 wt %, the effect of adding the ultraviolet light absorber decreases, and if more than 5 wt %, then undesirably the insulation film properties decline after completion of firing. A more preferable range is 0.15 to 1 wt %. An organic dye as a ultraviolet light absorber can be added for example as described below. To a solution with an organic dye dissolved in an organic solvent prepared beforehand, an inorganic powder is added, and the mixture is dried. By this method, an inorganic powder of capsules individually covered with an organic film layer can be produced. In the present invention, it can happen that a metal such as Pb, Fe, Cd, Mn, Co or Mg or any of their oxides contained in the inorganic powder reacts with the reactive ingredient contained in the organic component, and so that the mixture (sheet slurry) consisting of the inorganic powder and the organic component is gelled in a short time, not allowing sheet forming. To prevent the reaction, it is preferable to add a stabilizer for preventing gelation. It is preferable to use a triazole compound as the stabilizer. Among triazole compounds, especially benzotriazole acts effectively. The surface treatment of the glass powder using benzotriazole used in the present invention is for example as described below. Benzotriazole is dissolved into an organic solvent such as methyl acetate, ethyl acetate, ethyl alcohol or methyl alcohol by a predetermined amount based on the amount of the inorganic powder, and the inorganic powder is immersed in the solution for 1 to 24 hours for sufficient impregnation. After completion of immersion, the treated inorganic powder is naturally dried preferably at 20 to 30° C. to evaporate the solvent, thus preparing a triazole treated powder. It is preferable that the ratio of the stabilizer used (stabilizer in organic powder) is 0.05 to 5 wt %.

The sensitizer is added to improve sensitivity. The sensitizers which can be used here include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)-benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)-isonapthothiazole, 1,3-bis(4-dimethylaminobenzal)acetone, 1,3-carbonyl-bis(4-diethylaminobenzal)acetone, 3,3-carbonyl-bis(7-diethylaminocoumarin), N-phenyl-N-ethylethanolamine, N-phenylethanolamine, N-tolyldiethanolamine, N-phenylethanolamine, isoamyl dimethylaminobenzoate, isoamyl diethylaminobenzoate, 3-phenyl-5-benzoylthiotetrazole, 1-pheny-5-ethoxycarbonylthio-tetrazole, etc. In the present invention, one or more of them can be used. Some of the sensitizers can also be used as photo polymerization initiators. When a sensitizer is added to the photosensitive ceramic green sheet of the present invention the amount is usually 0.05 to 5 wt % based on the weight of the reactive ingredient. A more preferable range is 0.1 to 2 wt %. If the amount of the sensitizer is too small, the effect, of improving photosensitivity cannot be manifested, and if too large, the remaining ratio of exposed portions may be too small.

The polymerization inhibitor is added to improve the thermostability during storage. The polymerization inhibitors which can be used here include hydroquinone, monoesterified products of hydroquinone, N-nitrosodiphenylamine, phenothiazine, p-t-butylcatechol, N-phenylnaphthylamine, 2,6-di-t-butyl-p-methylphenol, chloranil, pyrogallol, etc. When a polymerization inhibitor is added, the amount is usually 0.001 to 1 wt % based on the weight of the photosensitive ceramic green sheet.

The plasticizers which can be used here include dibutyl phthalate, dioctyl phthalate, polyethylene glycol, glycerol, etc The antioxidant is added to prevent the oxidation of the acrylic copolymer during storage The antioxidants which can be used here include 2,6-di-t-butyl-p-cresol, butylated hydroxyanisole, 2,6-di-t-4-ethylphenol, 2,2-methylene-bis-(4-methyl-6-t-butylphenol), 2,2-methylene-bis(4-ethyl-6-t-butylphenol), 4,4-bis-(3-methyl-6-t-butylphenol), 1,1,3-tris-(2-methyl-6-t-butylphenol), 1,1,3-tris-(2-methyl-4-hydroxy-t-butylphenyl)butane, bis[3,3-bis-(4hydroxy-3-t-butylphenyl)butyric acid]glycol ester, dilaurylthio dipropionate, tripheny phosphite, etc. When an antioxidant is added, the amount is usually 0.001 to 1 wt % in the photosensitive ceramic green sheet.

The photosensitive ceramic green sheet of the present invention may contain an organic solvent when it is desired to adjust the viscosity of the sheet slurry. The organic solvents which can be used here include methyl cellosolve, ethyl cellosolve, butyl cellosolve, methyl ethyl ketone, dioxane, acetone, cyclohexanone, cyclopentanone, isobutyl alcohol, isopropyl alcohol, tetrahydrofuran, dimethyl sulfoxide, -γ-butyrolactone, bromobenzene, chlorobenzene, dibromobenzene, dichlorobenzene, bromobenzoic acid, dilorobenzoic acid and organic solvent mixtures containing any one or more of them.

The photosensitive ceramic green sheet is usually produced according to the following procedure. At first, a photosensitive polymer, photosensitive monomer, photo polymerization initiator, dispersing agent solvent, etc. are mixed, and the mixture is filtered, to obtain an organic vehicle. To it, an inorganic powder coated with an ultraviolet light absorber is added, and the mixture is homogeneously dispersed by a kneading machine such as a ball mill, to produce a sheet slurry. The viscosity of the sheet slurry can be properly adjusted by adjusting the mixing ratio of the inorganic powder, thickener, organic solvent, plasticizer, precipitation preventive agents, etc., and is 1000 to 5000 cps (centipoises). The obtained slurry is continuously formed into a 0.05 to 0.5 mm thick layer on a film of a polyester, etc. by any general method such as doctor blade method or extrusion molding.

It is preferable that the photosensitive ceramic sheet of the present invention has the following properties:

(1) The average pore size is in a range of 100 to 1000 nm.

(2) The total volume of the pores contained in the ceramic green sheet is in a range of 0.02 to 0.2 $cm^3$.

(3) After heat treatment at 80 to 100° C., the average pore size is in a range of 100 to 1000 nm and the pore volume is in a range of 0.04 to 0.2 $cm^3$.

(4) In the case of a 50 $\mu$m or thicker ceramic green sheet, after heat treatment at 80 to 100° C., the average pore size in the portion from the surface to a depth of 10 $\mu$m is in a range of 100 to 1000 $\mu$m, and the pore volume is in a range of 0.04 to 0.2 $cm^3/g$.

(5) In the case of said ceramic green sheet, after exposure to ultraviolet light, the average pore size is in a range of 100 to 1000 nm, and the pore volume is in a range of 0.04 to 0.2 $cm^3/g$.

The pore size distribution and the pore volume were measured using a mercury porosimeter. With a piece of a sheet placed in a measuring cell, the pressure P (MPa) necessary for pressing mercury into the vacancies with radius r ($\mu$m) in the individual not wetted by mercury can be given by the following formula:

$$r=0.75/P$$

While the pressure was changed, the amount of mercury pressed in the vacancies was recorded, to obtain a distribution of vacancy diameters. The pressure for pressing in mercury was raised to 30,000 atmospheric pressure, and pore sizes to about 2 nm could be obtained.

When the pore size and pore volume conform to the above conditions (1) to (5), a highly adhesive multi-layer fired board not swollen at the time of sheet lamination or filing can be produced. If the pore size or volume is smaller than the above range, the sheets are low in air permeability, and at the time of lamination, air bubbles are likely to be trapped. In this case, the air bubbles remaining between sheets at the time of firing are expanded to cause swelling and delamination. On the contrary, if the pore size or pore volume is larger than the above range, the board density after firing is not improved, and the board remains porous to be lowered in strength.

The photosensitive ceramic green sheet can have through holes formed for example as described below.

After through holes are formed in the green sheet, the sheet is coated on the surface with an adhesive, etc., and laminated with other similar sheets by thermocompression bonding. In this case, the sheet is shrunken by straining or thermosetting. The shrinkage in this case must be kept at 0.1% or less. So, it is preferable to anneal before forming the through holes for keeping the sheet sufficiently shrunken. The thermocompression bonding for sheet lamination is usually effected at 80 to 120° C. So, it is preferable to effect the annealing at 90° C. to 140° C. for 1 minute 3 hours. By this treatment, the sheet shrinkage after formation of through holes can be kept at 0.1% or less.

The formed sheet is exposed through a photo mask. For the mask, either negative type or positive type is selected, depending on the photosensitive organic component used The active light source used in this case can be, for example, near ultraviolet light, ultraviolet light, electron radiation, X radiation, etc. Among them, ultraviolet light is preferable, and the light sources which can be used for it include, for example, a low pressure mercury lamp, high pressure mere lamp, extra-high pressure mercury lamp, halogen lamp, microbicidal lamp, etc. Among them, an extra-high pressure mercury lamp is suitable. The exposure conditions depend on the coating thickness, but exposure is is effected for 5 seconds to 30 minutes using an extra-high pressure mercury lamp with an output of 5 to 100 $mW/cm^2$. In ordinary exposure, the sheet is irradiated with ultraviolet light on one side, but to obtain a higher resolution, the sheet may be exposed on both sides. For exposing the sheet on both sides, the sheet can be exposed simultaneously on the upper and under sides, or the sheet can be exposed on one side and reversed to be exposed similarly on the other side. In the case of exposure on both sides, a ceramic green sheet with a thickness double that of an ordinary ceramic green sheet exposed on one side only can have through holes formed.

In the case of exposure on both sides, the exposure value on each side can be smaller than that on the sheet to be exposed on one side only. A predetermined exposure value can be achieved by one irradiation step, or by several irradiation steps.

Usually in the formation of through holes, the surface condition of the green sheet is very important. If the sheet surface is too rough at the time of exposure, through hole formability declines. In the present invention, in the case of 4 mm evaluation length and 0.8 mm cutoff value, if the arithmetical mean roughness in conformity with JIS B 0601 is the average surface roughness of the ceramic green sheet, it is preferable that the mean surface roughness is 1 $\mu$m or less. It is not preferable that the surface roughness is larger than 1 $\mu$m, since surface scattering is caused at the time of exposure.

When the ceramic green sheet is heat-treated at 80° C. to 100° C. before exposure, it is preferable for the above reason that the mean surface roughness after heat treatment is 1 $\mu$m or less.

Even if the green sheet surface is specular, through hole formability declines. It is preferable that the glossiness of the sheet surface is 70% or less. If the glossiness is higher than 70%, reflection is caused to lower the through hole formability.

If the glossiness is in the above range, the light scattering on the sheet surface at the time of exposure can be decreased, and uniform and straight through holes can be formed.

Furthermore, the light transmittance of the green sheet is also important. If the total light transmittance of the photosensitive ceramic green sheet is Tt and the diffusion transmittance is Td, then the normal transmittance can be obtained from the following formula:

$$Tn=(Tt-Td)\times 100/Tt$$

For measurement, a spectrophotometer (Model UV-310IPC produced by Shimadzu Corp.) was used at a slit width of 7.5 nm at a measuring speed of 100 nm/min, using a halogen lamp (360 to 800 nm) and a deuterium lamp (200 to 360 nm) as light sources and $BaSO_4$ as a subsidiary white board at an incident angle of 0°, and the transmittance at a wavelength of 436 nm was obtained. As a result, when the total light transmittance was 10% or more and when the normal transmittance was 2% or more, the photosensitive ceramic green sheet could have through holes formed in a very good state. By matching the inorganic powder with the organic component in refractive index, the ultraviolet light transmittance improves. To obtain the transmittance, a 40 $\mu$m thick sample was sealed between quartz plates, and the total light transmittance and diffusion transmittance at 436 nm were obtained. The transmittance depends on the thickness, and declines with the increase of thickness. In this specification, the transmittances of 40 $\mu$m thick samples are shown.

If an oxygen barrier film is formed on the surface of the photosensitive ceramic green sheet, pattern formability can be enhanced. The oxygen barrier film can be, for example, a PVA film. The PVA film can be formed by coating a substrate with a 0.5 to 5 wt % aqueous solution uniformly by such a method as spin coating, and keeping at 70 to 90° C. for 10 to 60 minutes. A preferable PVA solution concentration is 1 to 3 wt %. If the concentration is in this range, the sensitivity can be further improved. The reason why the PVA coating can improve the sensitivity is estimated to be as follows. If the oxygen in air exists when the reactive ingredient photo-reacts, the oxygen is considered to disturb the sensitivity of photosetting, but if a PVA film exists, extra oxygen can be intercepted, to improve the sensitivity at the time of exposure preferably. In addition to PVA, a transparent polymer such as methyl cellulose can also be used.

After completion of exposure, a developer is used for development. In this case, immersion or spraying is used. The developer used can be an organic solvent in which the organic component in the photosensitive ceramic green sheet can be dissolved. To the organic solvent, water can be added as far as its dissolving power is not lost. If the photosensitive ceramic green sheet contains a compound with a carboxyl group, an alkaline aqueous solution can be used for development. As the alkaline aqueous solution, any aqueous metallic alkali solution such as of sodium hydroxide or calcium hydroxide can be used, but the use of an aqueous organic alkali solution is preferable since the alkali ingredient can be easily removed at the time of firing. The organic alkalis which can be used here include general amine compounds such as tetramethylammonium hydroxide, trimethylbenzylammonium hydroxide, monoethanolamine and diethanolamine. The concentration of the aqueous alkali solution is usually 0.01 to 10 wt %, but a preferable range is 0.1 to 5 wt %. If the alkali concentration is too low, the non-exposed portions cannot be removed, and if the alkali concentration is too high, then undesirably the exposed portions may be corroded.

The temperature range of the developer can be specified to shorten the development time compared with the conventional time and to allow highly accurate through holes to be formed without eroding hardened portions. The developer used can be any organic solvent as far as it can dissolve the organic component in the photosensitive green sheet. To the organic solvent, water can be added as far as its dissolving power is not lost. When a compound with a carboxyl group exists in the photosensitive ceramic green sheet, in general, aqueous solution of any alkali can be used. As the alkaline aqueous solution, an aqueous metallic alkali solution such as aqueous solution of sodium hydroxide, calcium hydroxide or aqueous sodium carbonate solution can be used. However, it is preferable to use an aqueous organic alkali solution since it is easy to remove the alkali ingredient at the time of firing. The organic alkalis which can be used here include general amine compounds such as tetramethylammonium hydroxide, trimethylbenzylammonium hydroxide, monoethanolamine and diethanolamine. The concentration of the aqueous alkali solution is usually 0.01 to 10 wt %, and a preferable range is 0.1 to 5 wt %. If the alkali concentration is too low, the non-exposed portions cannot be removed, and if too high, then undesirably the exposed portions may be corroded. It is preferable that the temperature of the developer is 25 to 50° C., and a more preferable range is 30 to 40° C. If the temperature is lower than 25° C., such problems arises in that the non-exposed portions are not removed, and that it takes long time for development. If the temperature is higher than 50° C., the dissolving reaction progresses so fast as to corrode the exposed portions, and it is difficult to form accurate through holes. For is development, general immersion or spraying can be used. Spraying has an advantage in that the development time can be short since the dissolving reaction progresses while the non-exposed portions are removed by the physical force of spraying. The spray method has an advantage in that the development time can be shortened since the non-exposed portions can be removed by the physical force of spraying during the dissolving reaction. Furthermore, since the supplied developer is always new, dissolving power of the developer does not decline. Furthermore, ultrasonic waves can also be used for shortening the development time. In this case, the non-exposed portions remaining due to irregular development can be removed by using ultrasonic waves. The ultrasonic waves are generated using an ultrasonic washer. It is preferable that the frequency of ultrasonic waves is 20 to 50 kHz. It is desirable that the oscillation output is 40 to 100 W. If the output is less than 40 W, the non-exposed portions cannot be removed perfectly, and if more than 100 W, the hardened portions are eroded, not allowing accurate through holes to be formed.

The photosensitive ceramic green sheet used in the present invention refers to, in principle, a single-layer sheet coated with a slurry and having the solvent removed, and not yet exposed, in the production process described later. By the same method as used for forming through holes, the guide holes for alignment for sheet lamination can be formed.

By the method described above, a sheet with a thickness of 20 to 600 $\mu$m before firing and with through holes of 20 to 200 $\mu$m in diameter formed at 30 to 250 $\mu$m pitch in the densest through hole pattern area can be produced. A through hole pattern finer than this has not been confirmed in the photolithography of the present invention. A through hole pattern coarser than this can be produced by the photolithography of the present invention, but there is no necessity for using the method of the present invention for such a pattern.

The photosensitive conductive paste consists of a conductive powder and a photosensitive organic component. The materials which can be used for the conductive powder include metals such as Cu, Au, Ag, Pd, Pt, W, Mn, Ni and Mo, alloys containing any of them, and the following resistors. As the photosensitive organic component, the same material as that used for the photosensitive ceramic green sheet can be used.

Cu based conductive powders include, for example, binary or ternary mixed metal powders of Cu(97-70)-Ag(3-

30), Cu(95-60)-Ni(5-40), Cu(90-70)-Ag(5-20)-Cr(3-15), etc. (the parenthesized numerals are in wt %; hereinafter this applies). Among them, Cu—Ag powder is preferable, and of it, a powder in which Cu grains are coated on the surfaces with 3 to 30 wt % of Ag is especially preferable since the oxidation of Cu can be prevented.

Preferable Au, Ag, Pd or Pt based conductive powders include, for example, binary or ternary mixed metal powders of Ag(30-97)-Pd(70-3), Ag(40-70)-Pd(60-10)-pt)5-20), Ag(30-80)-Pd(60-10)-Cr(5-15), Pt(20-40)-Au(60-40)-Pd (20), Au(75-80)-Pt(25-20), Au(60-80)-Pd(40-20), Ag(40-95)-Pt(60-5), Pt(60-90)-Rh(40-10), etc. Among them, a powder containing Cr or Rh is especially preferable since high temperature properties can be improved.

W, Mo or Mn based conductive powders include W, Mo and binary or tertiary mixed metal powders of W(92-98)-$TiB_2$(8-2), W(92-98)-$ZrB_2$(2-8), W-(92-98)-$TiB_2$(1-7)-$ZrB_2$ (1-7), W(95-60)-TiN(5-60), W(90-60)-TiN(5-35)-$TiO_2$(2-10), W(90-60)-TiN(5-35)-$TiO_2$(2-10)-Ni(1-10), W(99.7-97)-AlN(0.3-3), W(10-90)-Mo(90-10), W(92-98)-$Al_2Y_2O_3$ (8-2), Mo(92-98)-TiB(8-2), Mo(92-98)-$ZrB_2$(8-2), Mo(92-8)-$TiB_2$(1-7)-$ZrB_2$( 1-7), Mo-TiN, Mo(90-60)-TiN(5-35)-$TiO_2$(2-10), Mo(90-60)-TiN(5-35)-$TiO_2$(2-10)-Ni(1-10), Mo(99.7-97)-AlN(0.3-3), Mn(50-90)-Mo(10-50), Mo(60-90)-Mn(40-10)-$SiO_2$(0-20), W(30-90)-Mo(30-70)-Mn(3-30), etc. Among them, a powder containing $TiB_2$, $ZrB_2$, TiN, AlN, Ni or $TiO_2$ is especially preferable since the bonding strength between the conductive film and the alumina substrate can be enhanced, to give an effect of lowering the resistance of the conductive film.

Resistor powders include $RuO_2$ powder, $RuO_2$ based powder, glass powder containing Al powder and $B_2O_3$, glass powder containing Al powder, transition metal powder and $B_2O_3$, $In_2O_3$ based material-glass powder, $RuO_2$-glass powder, LaB6-glass powder, SnO2-containing product-glass powder, silicide-glass powder, glass powder consisting of NiO and $Li_2O_3$-$B_2O_3$-$SiO_2$RO (R is one selected from Mg, Ca, Sr and Ba), etc.

The $RuO_2$ can be amorphous or crystalline, or $CdBiRu_2O_7$, $BiRu_2O_7$, $BaRuO_6$, $LaRuO_3$, $SrRuO_8$, $CaRuO_3$, $Ba_2RuO_4$, etc. called pyrochlore compounds. $RuO_2$ based material can be $RuO_2$-$SiO_2$.

The glass powder containing Al powder and $B_2O_3$ can consist of 4 to 15 wt % of Al and 96 to 85 wt % of a glass powder containing $B_2O_3$. The glass powder containing $B_2O_3$ can be of $B_2O_3$-BaO-$SiO_2$-$TaiO_5$-$Al_2O_3$-CaO-MgO, etc. It can also contain a metal silicide such as $MoSi_2$, $AlSi_2$, $WSi_2$ or $TiS_2$.

The glass powder containing Al powder, transition metal powder and $B_2O_3$ contains a transition metal powder of Nb, V, W, Mo, Zr, Ti or Ni, etc. in addition to the glass powder containing Al powder and $B_2O_3$.

The $In_2O_3$-based material-glass powder can consist of 30 to 80 wt % of $In_2O_3$ based material and 70 to 20 wt % of glass powder. The $In_2O_3$ based material can be $SnO_3$+$SnO_2$ doped with ITO ($In_2O_3$ doped with Sn), $In_2O_3$ or Sb. The glass powder can be $SiO_2$-$Al_2O_3$-MgO-ZnO-$B_2O_3$-BaO based materials. Among them, $SiO_2$-$B_2O_3$ based material is preferable since sintering can be effected at a low temperature.

The photosensitive paste is usually prepared by mixing respective ingredients such as an inorganic powder, ultraviolet light absorber, photosensitive polymer, photosensitive monomer, photo polymerization initiator, glass frit and solvent at a predetermined ratio, and homogeneously dispersing the mixture by a three-roller mill or kneading machine.

The viscosity of the paste can be properly adjusted by adjusting the amounts of the inorganic powder, thickener, organic solvent, plasticizer, precipitation preventive agents, etc., but is 2000 to 200,000 cps (centipoises). For example, when a glass substrate is coated by spin coating in addition to screen printing, it is preferable that the viscosity is 200 to 5000 cps. To obtain a 10 to 20 $\mu$m film by one time of screen printing, it is preferable that the viscosity is 50,000 to 200,000 cps.

When a pattern is formed on the surface of the ceramic green sheet, it is important that the solvent contained in the applied photosensitive paste does not dissolve the ceramic green sheet. Otherwise there arises a problem that the solvent of the photosensitive paste reacts with the resin of the ceramic green sheet, not allowing the pattern to be formed. So, it is desirable to select at least one from ketones, lower alcohols, fatty acid higher alcohol esters and hydrocarbons as the solvent.

The method for forming a circuit wiring pattern using a photosensitive conductive paste on the ceramic green sheet with a through hole pattern formed on it by exposure and development as described above is described below.

In the present invention, the following methods are available;

(1) The ceramic green sheet with through holes formed is coated on the surface with a photosensitive conductive paste, and the through holes are filled with the conductive paste simultaneously.

(2) After a circuit wiring pattern is formed on a film, it is transferred onto the ceramic green sheet by a hot press.

At first, the method for simultaneously filling the through holes with a conductive paste and coating the ceramic green sheet with the conductive paste is described below in detail. In this method, as soon as the ceramic green sheet is coated on the surface with a photosensitive paste, the conductive paste is embedded in the through holes. The substrate of the sheet with through holes formed is removed, and the sheet is fixed by vacuum suction from the back side, and fully coated on the surface with a photosensitive conductive paste containing copper, silver, silver-palladium, tungsten, molybdenum or gold by screen printing, spin coating or applicator, etc., while the through holes are filled with the conductive paste simultaneously, to form conductors for inter-layer connection for wiring.

In succession, according to the procedure as described above, the sheet is coated on the surface with a predetermined photosensitive conductive paste, resistor paste, dielectric paste or insulator paste. For coating a glass substrate or ceramic substrate or a polymer film fully or partially with a photosensitive paste, a general method such as screen printing, bar coater, roll coater, die coater or blade coater can be used. The coating thickness can be adjusted by selecting the coating times, screen mesh size and paste viscosity.

When a substrate is coated with a paste, the substrate can be treated on the surface to improve the adhesiveness between the substrate and the coating film. The surface treatment liquid can be a silane coupling agent such as vinyltrichlorosilane, vinyltrimethoxysilane, vinyltriethoxysilane, tris-(2-methoxyethoxy)vinylsilane, 7-glycidoxypropyltrimethoxysilane, γ-(methacryloxypropyl)trimethoxysilane, γ(2-aminoethyl) aminopropyltrimethoxysilane, γ-chloropropyltrimethoxysilane, γ-mercaptopropyltximethoxysilane or γ-aminopropyltriethoxysilane, or an organic metal such as organic titanium, organic aluminum or organic zirconium. The silane coupling agent or organic metal is diluted to a concentration of 0.1 to 5% by an organic solvent such as ethylene glycol monomethyl ether, ethylene glycol monoethyl ether, methyl alcohol, ethyl alcohol, propyl alcohol or butyl alcohol, etc. Then, the surface treatment liquid is uniformly applied onto the substrate by a spinner, etc., and dried at 80 to 140° C. for 10 to 60 minutes, for surface treatment.

Furthermore, when a film is coated, the coating is dried on the film, to be followed by exposure, or the film is stuck onto a glass or ceramic substrate, to be followed by exposure.

The photosensitive paste of the present invention is applied onto a polyester film, etc., to obtain a photosensitive ceramic green sheet used for a circuit material or display. To form a pattern on the ceramic green sheet fully coated with the photosensitive paste, a photo mask with a circuit pattern is used for exposure to ultraviolet light, to photoset the photosensitive paste. In this case, to identify the locations of the preformed through holes, a highly accurate alignment gauge is installed to ensure that the photo mask of the through holes agrees with the photo mask of the line pattern on the sheet.

Subsequently, the non-exposed portions are removed by a developer, to obtain a fine pattern and through holes as per the mask. After completion of exposure, development is effected by using the difference between the solubility of the photosensitive portions and that of the non-photosensitive portions in the developer. In this case, immersion, spraying or brushing is used. The developer used can be an organic solvent which can dissolve the organic component in the photosensitive paste. Water can also be added to the organic solvent as far as its dissolving power is not lost. When a compound with an acidic group such as a carboxylic group exists in the photosensitive paste, an alkaline aqueous solution can be used for development. The alkaline aqueous solution can be an aqueous metallic alkali solution such as sodium hydroxide, sodium carbonate or calcium hydroxide aqueous solution, but it is preferable to use an aqueous organic alkali solution since it is easy to remove the alkali ingredient at the time of firing. The organic alkalis which can be used here include general amine compounds such as tetramethylammonium hydroxide, trimethylbenzylammonium hydroxide, monoethanolamine, diethanolamine, etc. The concentration of the aqueous alkali solution is usually 0.01 to 10 wt %, and a more preferable range is 0.1 to 5 wt %. If the alkali concentration is too low, the soluble portions cannot be removed. If too large, then undesirably the pattern area may be peeled and the insoluble portions may be corroded. It is preferable in view of process control that the development temperature 20 to 50° C. The ultraviolet light source used for exposure and the developer used for development are the same as those used for the photosensitive ceramic green sheet.

An example of transfer using photolithography is described below in detail.

The film used for transfer can be a general film. For example, a polyester film, polypropylene film or nylon film, etc. can be used. As the film for transfer, a film excellent in handling convenience at the time of transfer, exposure and development and with moderate releasability is preferable. It is preferable to select the physical properties of the transfer film in the following ranges;

(a) Film thickness : 25~200 $\mu$m
(b) Strength : 3000~5000 MPa
(c) Surface condition : 0.02~0.15 $\mu$m The film is coated, as required, on the surface with wax, melamine or silicone, etc. for better releasability. It is essential to keep the peeling strength in a certain range. The peeling strength is expressed by the average load required for removing a 24 mm wide adhesive tape bonded on the releasably coated surface of the film at a constant speed using a tension tester. It is desirable that the load is in a range of 3 to 7 N/24 mm. If the load is larger than the range, the pattern remains on the film at the time of transfer, and if smaller than the range, the paste is hard to slay on the film, not allowing the pattern to be formed. A more preferable range is 4 to 6 N/24 mm.

At first, the photosensitive conductive paste is applied onto the surface-treated film by ordinary screen printing or doctor blade method. Then, a photo mask with a circuit pattern is used for exposure to ultraviolet light, to photoset the photosensitive paste. Subsequently, the non-exposed portions are removed by a developer, to obtain a fine pattern as per the mask. The exposure conditions depend on the coating thickness of the paste, but it is preferable to expose using an extra-high pressure mercury lamp with an output 5 to 100 mW/cm$^2$ for 20 seconds to 30 minutes.

After completion of exposure, a developer is used for development by immersion or spraying. The developer used can be an aqueous organic alkali solution which can dissolve a mixture consisting of said acrylic copolymer with ethylenic unsaturated groups at the side chains or molecular ends, photoreactive compound and photo polymerization initiator. The concentration of the aqueous alkali solution is usually 0.01 to 5 wt %.

The transfer film obtained like this is overlapped on the ceramic green sheet, and pressed at 1 to 1.5 MPa by a pressure roller heated to 60° C.~90° C., to transfer the conductor pattern onto the ceramic green sheet.

To embed a conductive paste in the through holes of the ceramic green sheet, the ceramic green sheet used has through holes formed by cemented carbide drills. For embedding, the through holes are filled with a conductor paste of copper, silver, silver-palladium, tungsten, molybdenum or gold, to form conductors for inter-layer connection for wiring in the through holes. The embedding of the conductor paste into the through holes of the ceramic green sheet is repeated for each sheet.

The ceramic green sheet has a predetermined conductor pattern, resistor pattern, dielectric pattern or insulator-pattern printed on the surface according to the method as described above, and guide holes are formed.

The method described above allows the production of a pattern-formed sheet with lines of 10 to 100 $\mu$m and spaces of 10 to 500 $\mu$m as the densest lines and spaces in a circuit wiring pattern with a thickness of 10 to 100 $\mu$m before firing. A circuit wiring pattern denser than this has not been confirmed in the photolithography of the present invention. A pattern coarser than it can be easily produced by the photolithography of the present invention, but there is no necessity for using the photolithography for such a pattern.

Subsequently, as many such sheets as necessary are laminated in reference to the guide holes, and bonded at a pressure of 5 to 25 MPa at 80 to 150° C., to make a multi-layer sheet. For sheet lamination, a circuit wiring pattern is formed beforehand on the surface of a sheet, and it is coated with a butyl alcohol based adhesive or acrylic adhesive, etc., and 2 to 30 sheets are positioned and pressed by a hot press. The press temperature is 80 to 200° C., and the press pressure is 5 to 20 MPa. In sheet lamination, it is important that the sheets are sufficiently air permeable and flexible.

It is desirable that an air permeable film or synthetic paper, etc. is placed between the mold press face heated to 80 to 200° C. and the ceramic green sheet, for pressing. It is important that the mold itself has a moderate surface roughness to secure air permeability. An almost specularly ground surface does not allow the air bubbles between the mold and the sheet to escape at the time of pressing, causing them to be trapped. So, at the time of firing, they are expanded to cause swelling.

If the pressing temperature is lower than 80° C., the resin is little deformed, not allowing lamination. On the contrary if higher than 200° C., the resin is softened to deform the sheets too much. Therefore, an optimum temperature range is 80 to 200° C. A more preferable range is 90 to 150° C. If the pressing pressure is less than 5 MPa, the sheets cannot have sufficient bonding strength even if there is an adhesive. On the contrary if more than 20 MPa, the sheets themselves reach the yield strength and are crushed. The pressure range is usually 5 to 20 MPa, and a more preferable range is 7 to 15 MPa. As described before, if optimum press conditions are selected, a good sheet laminate can be obtained.

After completion of sheet lamination, the sheet laminate is fired in a firing furnace. The firing atmosphere and temperature depend on the inorganic powder and organic component used in the ceramic green sheets, but firing is effected in air, nitrogen atmosphere or hydrogen reducing atmosphere at 600 to 1600° C. If alumina or aluminum nitride is used as the inorganic powder, a tungsten paste is used for forming the pattern. So, firing is effected in hydrogen reducing atmosphere at 1500 to 1600° C. for 10 to 60 minutes.

When a glass ceramic composite powder is used, mullite phase, cordierite phase, etc. are precipitated as main crystal components in the glass powder during firing, and even at the interfaces between the ceramic powder and the glass powder, mullite phase, cordierite phase, suffilin phase, etc. can be precipitated. As a result, the mechanical strength of the glass substrate itself can be improved.

In the above process, a heating step of 100 to 500° C. can also be introduced for drying, binder removal and preliminary reaction.

According to the method described above, a ceramic package with via holes of 15 to 150 $\mu$m in diameter formed at 25 to 200 $\mu$m pitch in the densest through hole pattern in a 15 to 500 $\mu$m thick fired board and with 8 to 80 $\mu$m lines and 8 to 400 $\mu$m spaces as the densest lines and spaces in a 7 to 80 $\mu$m thick circuit wiring pattern can be produced.

The ceramic board fired by the above method can be used as a package board on which is to be mounted a semiconductor integrated circuit and crystal oscillator.

The present invention is described below specifically with reference to examples, but is not limited thereto or thereby. In the examples of the present invention and comparative examples, concentrations are in wt %.

(Composition of ceramic green sheet)

(1) Inorganic powder
  A. Alumina powder:
    1.77 in refractive index, granular, 2.5 $\mu$m in average grain size
  B. Cordierite powder:
    1.56 in refractive index, 80% in spherical grain content by number, 2.0 $\mu$m in average grain size. Consisting of 20 wt % of $Al_2O_3$, 48 wt % of $SiO_2$, 8 wt % of $B_2O_3$ and 24 wt % of MgO.
  C. Glass ceramic powder:
    1.58 in refractive index, 80% in spherical grain content by number, 2.5 $\mu$m in average grain size. Consisting of 34.5 wt % of $Al_2O_3$, 38.2 wt % of $SiO_2$, 9.2 wt % of $B_2O_3$, 5.1 wt % of BaO, 4.8 wt % of MgO, 4.4 wt % of CaO and 2.1 wt % of $TiO_2$.

(2) Ultraviolet light absorber
  Azo dye:
    Sudan IV, $C_24H_2ON_4O$ in chemical formula, 380.45 in molecular weight.

(3) Photosensitive polymer
  A polymer obtained by letting 30% of glycidyl acrylate addition-react with a copolymer consisting of 30% of methacrylic acid, 30% of methyl methacrylate and 40% of styrene (4) Photosensitive monomer
  Trimethylolpropane tracrylate modified PO (5) Solvent
  A mixed solvent consisting of isopropyl alcohol, n-butyl alcohol and methyl ethyl ketone (6) Photo polymerization initiator
  2-methyl-1-[4-(methylthio)phenyl]-2-morpholinopropanone (7) Sensitizer
  2,4-diethylthioxanthone (Composition of photosensitive paste)

(1) Conductive powder
  A. Cu powder: Mono-dispersed granular, 3.1 $\mu$m in average grain size, 0.44 $m^2$/g in specific surface area
  B. Ag powder: Mono-dispersed granular, 3.7 $\mu$m in average grain size, 0.48 $m^2$/g in specific surface area
  C. W powder: Mono-dispersed granular, 3.0 $\mu$m in average grain size, 0.15 $m^2$/g in specific surface area (2) Photosensitive polymer
  A polymer obtained by letting glycidy) methacrylate (GMA) addition-react with a copolymer consisting of 40% of methacrylic acid (MAA), 30% of methyl methacrylate (MMA) and 30% of styrene (St) in an amount of 0.4 equivalent of GMA for each equivalent of MAA (3) Photosensitive monomer
  Trimethylolpropane triacrylate (4) Glass frit
  Glass frit 1:
    Consisting of 42 wt % of zirconium, 24 wt % of boron oxide, 21 wt % of silicon dioxide, 7 wt % of lithium oxide, 4 wt % of alumina and 2 wt % of other oxides.
  Glass frit 2:
    Consisting of 50 wt % of bismuth oxide, 7 wt % of silicon dioxide, 15 wt % of boron oxide, 14 wt % of zinc oxide and 14 wt % of barium oxide.

(5) Ultraviolet light absorber
  Azo dye:
    Sudan IV, $C_{24}H_{20}N_4O$ in chemical formula, 380.45 in molecular weight (6) Solvent
  γ-butyrolactone (7) Photo polymerization initiator
  α-amino acetophenone was added in an amount of 20% based on the total amount of the photosensitive polymer and the photosensitive monomer.

(8) Plasticizer
  Dibutyl phthalate (DBP) was added in an amount of 10% based on the amount of the photosensitive polymer.

(9) Sensitizer
  2,4-diethylthioxanthone was added in an amount of 20% based on the total amount of the photosensitive polymer and the photosensitive monomer.

(10) Sensitizing aid

Ethyl p-dimethylaminobenzoate (EPA) was added in an amount of 10% based on the total amount of the photosensitive polymer and the photosensitive monomer.

(11) Thickener

A solution with 15% of $SiO_2$ dissolved in 2-(2-butoxyethoxy)ethyl acetate was added in an amount of 4% based on the amount of the photosensitive polymer.

(12) Leveling agent

Special acrylic polymer solution: L-1980-50 (Kusumoto kasei K.K.)

(Production of photosensitive ceramic green sheet)

(1) Alumina green sheet

The ultraviolet light absorber was added to alumina powder, present in an amount of 0.15%, and 11.7% of the photosensitive polymer and 2.3% of the photosensitive monomer were added to 86% the treated alumina powder, to make 100 parts by weight an alumina paste. To it, 2% of the photo polymerization initiator, 2% of the sensitizer, 1% of the sensitizing aid and 12% of the solvent were added, to produce a photosensitive alumina green sheet slurry.

(2) Cordierite green sheet and glass ceramic green sheet

The ultraviolet light absorber was added to cordierite powder or glass ceramic powder, to be contained in an amount of 0.18%, and 11.7% of the photosensitive polymer and 2.3% of the photosensitive monomer were added to 86% of the treated inorganic powder, to produce 100 parts by weight of an inorganic paste. To it, 2% of the photo polymerization initiator, 2,% of the sensitizer, 1% of the sensitizing aid and 12% of the solvent were added, to produce a photosensitive ceramic green sheet slurry.

At first, the respective organic ingredients were heated at 60° C. while being ultrasonically dispersed, and the dispersion was filtered through a 400-mesh filter, to obtain an organic vehicle. To it, the inorganic powder coated with the light absorber was added, and the mixture was kneaded by a kneading machine, to obtain a sheet slurry. The slurry was applied onto a polyester film by a doctor blade, to form a sheet which was dried at 80° C., to prepare a 100 μm thick ceramic green sheet. The sheet was cut into 200 mm squares, and have through holes formed and a pattern formed on it.

(Production of photosensitive conductive paste)

(1) Copper paste

Eighty seven percent of copper powder, 6% of the photosensitive polymer, 3% of the photosensitive monomer and 4% of the glass frit 1 were mixed, to prepare a raw powder for a copper paste. To 100 parts by weight of the raw powder, were added 2% of the photo polymerization initiator, 2% of the sensitizer, 1% of the sensitizing aid, 0.6% of the plasticizer, 4% of the thickener and 0.5% of the leveling agent, to produce a copper paste.

(2) Silver paste

To 87% of silver powder with 0.18% of the ultraviolet light absorber added for treatment, were added 6% of the photosensitive polymer, 3% of the photosensitive monomer and 4% of the glass frit 2, to produce 100 parts by weight of a raw powder for a silver paste. To 100 parts by weight of the raw powder, were added 2% of the photo polymerization initiator, 2% of the sensitizer, 1% of the sensitizing aid, 0.6% of the plasticizer, 4% of the thickener and 0.5% of the leveling agent, to produce a silver paste.

(3) Tungsten paste

To 90% of tungsten powder, were added 6.5% of the polymer and 3.5% of the monomer, to produce 100 parts by weight of a raw powder for a tungsten paste. To 100 parts by weight of the raw powder, were added 2% of the photo polymerization initiator, 0.6% of the plasticizer, 4% of the thickener and 0.5% of the leveling agent, to produce a tungsten paste.

The procedure for producing the above conductive pastes is described below.

A. Preparation of organic vehicle

The solvent and the polymer were mixed, and with stirring, the mixture was heated to 80° C., to homogeneously dissolve all the polymer. The solution was cooled to room temperature, and the monomer, plasticizer, sensitizer, sensitizing aid, thickener, leveling agent and photo polymerization initiator were added for dissolution. The solution was filtered through a 400-mesh filter.

B. Preparation of light absorber added powder

A predetermined amount of the organic dye was weighed, and to a solution with it dissolved in acetone, the dispersing agent was added, and the mixture was stirred homogeneously by a homogenizer. Predetermined amounts of the conductive powder and the glass fit were added into the solution, and while acetone was evaporated in a local exhauster, the mixture was homogeneously dispersed, to produce a powder in which the grains of the conductive powder and the glass frit were coated homogeneously on the surfaces with the organic dye (so-called capsules).

C. Preparation of paste

The conductive powder and the glass frit treated by the organic dye to form capsules were added to the organic vehicle, to form a predetermined composition which was dispersed by a three-roller mill, to produce a paste.

(Formation of through holes)

A chromium mask designed to have mask through holes of 120 μm in diameter formed at 200 μm pitch was used, and a high pressure mercury lamp was used for exposure to ultraviolet light at 5.4 J/cm² in the case of one-side exposure, or at 3 J/cm² each sequentially or simultaneously in the case of both-side exposure.

Then, the exposed sheet was immersed in 0.5% monoethanolamine aqueous solution for 30 seconds for development.

After washing with water, the sheet was dried, and the average through hole diameter was measured. Uniform through holes of 75 μm could be formed in a 200 mm square.

(Formation of pattern)

As the surface treating solution, 0.5 wt % (2-aminoethyl) aminopropyl-trimethoxysilane isopropyl alcohol solution was used. One point zero milliliter of the solution was added dropwise onto a substrate, for coating by a spinner at a rotating speed of 3000 μm for 10 seconds, and was dried at room temperature for surface treatment.

The above paste was solid-printed on a 96% alumina sheet, cordierite sheet and glass/ceramics sheet (76 mm×76 mm×0.635 mm t each) in a size of 50 mm square using a 325-mesh screen, and simultaneously the through holes were filled with the paste. Each of the sheets was dried at 80° C. for 40 minutes. The coating thickness after drying was 25 μm. The coating film prepared as above was exposed to ultraviolet light using an extra-high pressure mercury lamp with an output of 500 mW/cm² on the upper side, using a chromium mask with electrodes formed in a fine pattern of 50 μm. The sheet was immersed in 0.5% monoethanolamine aqueous solution kept at 25° C., for development, and subsequently, the non-exposed portions were washed by water using a spray. Then, the water was blown away by an air gun, and the sheet was dried at 50° C. for 30 minutes.

The viscosity of the photosensitive conductive paste was measured using a Brookfield type viscometer at a rotating speed of 3 rpm.

For the electrodes after completion of filing, the pattern resolution was measured using a scanning electron microscope (SEM), and Ra was measured using a tracer type surface roughness tester.

The sheet with the through holes filled and with a pattern formed on it was coated with a butyl alcohol based adhesive, and overlapped on four other similar sheets, and thermally pressed at 120° C. at 10 MPa. In this case, aramid synthetic paper was placed between the mold surface and the sheets for lamination in 4 layers.

The ceramic green sheet with a pattern formed on it was dried at 80° C. for 1 hour, and fired at 850° C. in open air in the case of the copper based paste or silver based paste, and at 1550° C. in hydrogen reducing atmosphere in the case of the tungsten based paste.

To evaluate the fired board, the sectional form of the pattern and the uniformity of the through hole diameters were observed by a scanning electron microscope. The refractive indexes of the organic component and the inorganic powder were measured about the light with a wavelength of 436 nm, respectively by the ellipsometric method and the Becke's line detection method. The measurement according to the Becke's line detection method was effected at 25° C. using a high pressure mercury lamp and an interference filter for g-line at the light source section of an optical microscope.

In the following Examples 1 to 3, the photosensitive alumina green sheet and the photosensitive tungsten paste were used to experimentally manufacture a ceramic package respectively.

EXAMPLE 1

A 100 μm thick sheet was exposed on one side and shower-developed at 30° C. For pattern formation, the ceramic green sheet was fully coated with the conductive paste and had the through holes filled with the conductive paste simultaneously.

Still after completion of firing, the form of the through holes was good.

EXAMPLE 2

A 200 μm thick sheet was exposed one side by one side sequentially on both sides and shower-developed at 30° C. For pattern formation, the ceramic green sheet was fully coated with the conductive paste and had the through holes filled with the conductive paste simultaneously.

Still after completion of firing, the form of the through holes was good.

EXAMPLE 3

A 200 μm thick sheet was exposed on both sides simultaneously and shower-developed at 30° C. For pattern formation, a film was fully coated with the paste, and after through holes were formed, it was transferred onto the ceramic green sheet. As the transfer film, a polyester film with a peeling strength of 5 N/24 mm was used.

Still after completion of firing, the form of the through holes was good.

In the following Examples 4 to 6, the photosensitive cordierite green sheet was coated with the photosensitive copper paste or photosensitive silver paste, to experimentally manufacture a ceramic package respectively.

EXAMPLE 4

A 150 μm thick sheet was exposed on one side and shower-developed at 30° C. For pattern formation, the ceramic green sheet was fully coated with the copper paste and had the through holes filled with the copper paste.

Still after completion of firing, the form of the through holes was good.

EXAMPLE 5

A 250 μm thick sheet was exposed one side by one side sequentially on both sides, and shower-developed at 300° C. For pattern formation, a film was fully coated with the silver paste and had through holes formed, and the pattern was transferred onto the green sheet.

Still after completion of firing, the form of the through holes was good.

EXAMPLE 6

A 250 μm thick sheet was exposed simultaneously on both sides and s shower-developed at 30° C. For pattern formation, a film was fully coated with the silver paste and had through holes formed, and the pattern was transferred onto the ceramic green sheet.

Still after completion of firing, the form of the through holes was good.

In the following Examples 7 to 10, the photosensitive glass ceramic green sheet was coated with the photosensitive copper paste or photosensitive silver paste, to experimentally manufacture a ceramic package respectively.

EXAMPLE 7

A 200 ,μm thick sheet was exposed on one side and shower-developed at 30 ° C. For pattern formation, the ceramic green sheet was fully coated with the copper paste and had the through holes filled with the copper paste.

Still after completion of firing, the form of the through holes was good.

EXAMPLE 8

A 300 μm thick sheet was exposed on both sides simultaneously and shower-developed at 35° C. For pattern formation, a film was fully coated with the copper paste and had through holes formed, and the pattern was transferred onto the ceramic green sheet.

Still after completion of firing, the form of the through holes was good.

EXAMPLE 9

A 300 μm thick sheet was exposed on both sides simultaneously and shower-developed at 35° C. For pattern formation, a film was fully coated with the silver paste and had through holes formed, and the pattern was transferred onto the ceramic green sheet.

Still after completion of firing, the form of the through holes was good.

EXAMPLE 10

A 400 μm thick sheet was exposed on both sides simultaneously and shower-developed at 35° C. For pattern formation, a film was fully coated with the silver paste and had through holes formed, and the pattern was transferred onto the ceramic green sheet.

Still after completion of firing, the form of the through holes was good.

COMPARATIVE EXAMPLE 1

A 200 μm thick photosensitive alumina green sheet was exposed on one side and had through holes formed at a development temperature of 30° C.

Due to the scattering light at the interfaces with the inorganic component, the non-exposed portions were photoset, to cause a film to remain at the time of development, not allowing straight through holes to be obtained. In the case of exposure on one side, ultraviolet light could not be sufficiently transmitted by the 200 μm thick sheet.

COMPARATIVE EXAMPLE 2

A 300 μm thick photosensitive cordierite green sheet was exposed on one side and had through holes formed at a development temperature of 30° C.

Due to the scattering inside the ,inorganic component, the non-exposed portions were photoset, to cause a film to remain at the time of development, not allowing straight through holes to be obtained. In the case of exposure on one side, ultraviolet light could not be sufficiently transmitted by the 300 μm thick sheet.

TABLE 1

| Item | Example 1 | Example 2 | Example 3 | Example 4 | Example 5 | Example 6 |
|---|---|---|---|---|---|---|
| Refractive index of inorganic component | 1.77 | 1.77 | 1.77 | 1.563 | 1.563 | 1.563 |
| Refractive index of organic component | 1.61 | 1.61 | 1.61 | 1.594 | 1.594 | 1.594 |
| Difference of refractive index between inorganic component and organic component | 0.16 | 0.16 | 0.16 | 0.031 | 0.031 | 0.031 |
| Total light transmittance | 35 | 35 | 35 | 54 | 54 | 54 |
| Normal transmittance | 7 | 7 | 7 | 4 | 4 | 4 |
| Pore size (before heat treatment: nm) | 310 | 315 | 302 | 353 | — | — |
| Pore volume (before heat treatment: $cm^3/g$) | 0.08 | 0.08 | 0.07 | 0.06 | — | — |
| Pore size (after heat treatment: nm) | 336 | 350 | 364 | — | — | — |
| Pore size (after heat treatment: $cm^3/g$) | 0.09 | 0.09 | 0.10 | — | — | — |
| Pore size (surface portion: nm) | 355 | — | — | — | — | — |
| Pore volume (surface portion: $cm^3/g$) | 0.11 | — | — | — | — | — |
| Exposure method | One side | Both sides | Both sides simultaneously | One side | Both sides | Both sides simultaneously |
| Pore size (after exposure: nm) | 360 | 370 | 385 | — | — | — |
| Pore volume (after exposure: $cm^3/g$) | 0.14 | 0.12 | 0.16 | — | — | — |
| Surface glossiness | 65 | 55 | 55 | 65 | — | — |
| Surface roughness (before heat treatment: μm) | 0.6 | 0.6 | 0.6 | 0.4 | — | — |
| Surface roughness (after heat treatment: μm) | 0.8 | 0.9 | 0.9 | 0.7 | — | — |
| Sectional form of through holes | Straight | Straight | Straight | Straight | Straight | Straight |
| Diameter of through holes (μm) | 70 | 70 | 75 | 90 | 80 | 80 |
| Aspect ratio | 1.4 | 2.9 | 2.7 | 1.5 | 1.9 | 1.9 |
| Pattern forming method | Simultaneous | Simultaneous | Transfer | Simultaneous | Transfer | Transfer |
| Densest lines/spaces (μm) | 30/50 | 30/50 | 20/20 | 30/30 | 20/20 | 20/20 |
| Pattern thickness (μm) | 24 | 24 | 27 | 32 | 27 | 28 |
| Firing temperature (° C.) | 1550 | 1550 | 1500 | 850 | 850 | 850 |
| Refractive index of board | 1.76 | 1.76 | 1.77 | 1.56 | 1.56 | 1.56 |
| Through hole diameter of board (μm) | 55 | 55 | 58 | 66 | 60 | 60 |
| Through hole pitch | 180 | 180 | 180 | 180 | 180 | 180 |
| Densest lines/spaces (μm) | 23/38 | 23/38 | 15/15 | 23/23 | 15/15 | 15/15 |
| Specific resistance ($\mu\Omega \cdot cm$) | 14.5 | 14.5 | 14.5 | 3.8 | 3.6 | 2.9 |
| Expansion coefficient ($10^{-7}/K$) | 78 | 78 | 78 | 15 | 15 | 15 |
| Strenth of board (MPa) | 270 | 270 | 270 | 220 | 220 | 220 |
| Dielectric constant of board | 9.6 | 9.6 | 9.6 | 5.3 | 5.3 | 5.3 |
| Density ($g/cm^3$) | 3.68 | 3.68 | 3.68 | 2.37 | 2.36 | 2.35 |

TABLE 2

| Item | Example 7 | Example 8 | Example 9 | Example 10 | Comparative example 1 | Comparative example 2 |
|---|---|---|---|---|---|---|
| Refractive index of inorganic component | 1.585 | 1.585 | 1.585 | 1.585 | 1.77 | 1.563 |
| Refractive index of organic component | 1.594 | 1.594 | 1.594 | 1.594 | 1.45 | 1.594 |
| Difference of refractive index between inorganic component and organic component | 0.009 | 0.009 | 0.009 | 0.009 | 0.32 | 0.031 |
| Total light transmittance | 92 | 92 | 92 | 92 | 54 | 54 |
| Normal transmittance | 56 | 56 | 56 | 56 | 4 | 4 |
| Pore size (before heat treatment: nm) | 370 | — | — | — | — | — |
| Pore volume (before heat treatment: $cm^3/g$) | 0.04 | — | — | — | — | — |
| Pore size (after heat treatment: nm) | 385 | — | — | — | — | — |
| Pore volume (after heat treatment: $cm^3/g$) | 0.09 | — | — | — | — | — |
| Pore size (surface portion: nm) | 350 | — | — | — | — | — |
| Pore size (surface portion: $cm^3/g$) | 0.10 | — | — | — | — | — |
| Exposure method | One side | Both sides simultaneously | Both sides simultaneously | Both sides simultaneously | One side | One side |
| Pore size (after exposure: nm) | 390 | — | — | — | — | — |
| Pore volume (after exposure: $cm^3/g$) | 0.10 | — | — | — | — | — |
| Surface glossiness | 55 | — | — | — | — | — |
| Surface roughness (before heat treatment: μm) | 0.4 | — | — | — | — | — |
| Surface roughness (after heat treatment: μm) | 0.6 | — | — | — | — | — |
| Sectional form of through holes | Straight | Straight | Straight | Straight | Barrel-shaped | Barrel-shaped |
| Diameter of through holes (μm) | 80 | 70 | 65 | 105 | 80 | 80 |
| Aspect ratio | 2.5 | 4.3 | 4.6 | 3.8 | 1.25 | 1.88 |
| Pattern forming method | Simultanenus | Transfer | Transfer | Transfer | — | — |
| Denest lines/spaces (μm) | 30/30 | 30/30 | 20/20 | 20/20 | — | — |
| Pattern thickness (μm) | 22 | 24 | 24 | 32 | — | — |
| Firing temperature (° C.) | 850 | 850 | 850 | 850 | — | — |
| Refractive index of board | 1.59 | 1.59 | 1.59 | 1.59 | — | — |
| Through hole diameter of board (μm) | 61 | 55 | 58 | 66 | — | — |
| Through hole pitch | 180 | 180 | 180 | 180 | — | — |
| Densest lines/spaces (μm) | 23/25 | 23/28 | 15/15 | 23/23 | — | — |
| Specific resistance (μΩ · m) | 2.8 | 2.6 | 2.2 | 2.4 | — | — |
| Expansion coefficient ($10^{-7}$/K) | 51 | 51 | 51 | 51 | — | — |
| Strength of board (MPa) | 170 | 170 | 170 | 170 | — | — |
| Dielectric constant of board | 6.5 | 6.5 | 6.5 | 6.5 | — | — |
| Density (g/cm³) | 2.53 | 2.53 | 2.53 | 2.53 | — | — |

INDUSTRIAL APPLICABILITY

In the present invention, the refractive indexes of an organic component and an inorganic component in a photosensitive ceramic green sheet and a photosensitive conductive paste used for a ceramic board on which is to be mounted semiconductor devices are controlled to reduce the reflection and scattering at the interfaces between the organic component and the inorganic component, for allowing highly accurate through holes with a high aspect ratio to be formed and a circuit wiring pattern to be formed.

Thus, a circuit material, etc. can be processed to form a thick and highly accurate pattern, and a package can be downsized, densified and improved in yield.

What is claimed is:

1. A photosensitive ceramic green sheet comprising an inorganic powder and a photosensitive organic component satisfying the following formula:

$$-0.05 \leq N2-N1 \leq 0.1$$

wherein N1 is an average refractive index of the photosensitive organic component and N2 is an average refractive index of the inorganic powder,
wherein the inorganic powder comprises 30% or more of a glass powder.

2. A photosensitive ceramic green sheet according to claim 1,
wherein said inorganic powder has an average refractive index of 1.5 to 1.8.

3. A photosensitive ceramic green sheet according to claim 1 or 2,
wherein the photosensitive organic component has an average refractive index of 1.5 to 1.75.

4. A photosensitive ceramic green sheet according to claim 1 or 2,
wherein the inorganic powder is at least one filler selected from the group consisting of alumina, zirconia, magnesia, berylia, mullite, cordierite, spinel, forsterite, anorthite, celsian, silica and aluminum nitride.

5. A photosensitive ceramic green sheet according to claim 1 or 2,
wherein said inorganic powder comprises a mixture consisting of 30 wt % or more of a glass powder and 70 wt % or less of a powder of at least one inorganic filler selected from the group consisting of alumina, zirconia, magnesia, berylia, mullite, cordierite, spinel, forsterite, anorthite, celsian, silica and aluminum nitride.

6. A photosensitive ceramic green sheet according to claim 5, wherein the glass powder comprises 15 to 70 parts by weight of $SiO_2$;

10 to 60 parts by weight $Al_2O_3$;

4 to 20 parts by weight of $B_2O_3$;

1 to 25 parts by weight of MgO;

1 to 10 parts by weight of $TiO_2$; and 1 to 25 parts by weight of at least one compound selected from the group consisting of $Li_2O$, $Na_2O$, $K_2O$, BaO, CaO and PbO.

7. A photosensitive ceramic green sheet according to claim 5, wherein the glass powder has an average refractive index of 1.5 to 1.65.

8. A photosensitive ceramic green sheet according to claim 5, wherein alumina, cordierite or silica has a spherical grain content by number of 80% or more.

9. A photosensitive ceramic green sheet according to claim 1 or 2, wherein said inorganic powder has a spherical grain content by number of 80% or more.

10. A photosensitive ceramic green sheet according to claim 4, wherein alumina, cordierite or silica has a spherical grain content by number of 80% or more.

11. A photosensitive ceramic green sheet according to claim 1 or 2, comprising:

50 to 95 parts by weight of the inorganic powder and 5 to 50 parts by weight of the organic component.

12. A photosensitive ceramic green sheet according to claim 1 or 2, wherein said photosensitive organic component comprises an oligomer or polymer containing 10 wt % or more of at least one compound selected from a group consisting of styrene, halogenated styrene, α-methylstyrene and halogenated α-methylstyrene.

13. A photosensitive ceramic green sheet according to claim 1 or 2, wherein said photosensitive organic compound comprises a monomer containing 10 wt % or more of an acrylate or methacrylate having a benzene ring or an oligomer or polymer obtained by polymerizing a composition containing 10 wt % or more of said monomer.

14. A photosensitive ceramic green sheet according to claim 1 or 2, wherein the photosensitive organic compound contains 5 wt % or more of chemical groups selected from the group consisting of sulfur atoms, bromine atoms, iodine atoms, benzene rings, naphthalene rings, biphenyl rings, anthracene rings and carbazole rings.

15. A photosensitive ceramic green sheet according to claim 1 wherein said photosensitive organic compound comprises an ultraviolet light absorber in an amount of 0.05 to 5 wt %.

16. A photosensitive ceramic green sheet according to claim 15, wherein said ultraviolet light absorber comprises an organic dye.

17. A photosensitive ceramic green sheet according to claim 1 or 2, wherein said organic component contains 10 to 80 wt % of a polyfunctional acrylate or methacrylate compound.

18. A photosensitive ceramic green sheet according to claim 1 or 2, having a total light transmittance of 10% or more.

19. A photosensitive ceramic green sheet according to claim 1 or 2, having a normal light transmittance of 2% or more.

20. A ceramic green sheet according to claim 1 or 2, further comprising pores in the ceramic green sheet, said pores having an average pore size in the range of 100 to 1000 nm.

21. A ceramic green sheet according to claim 1 or 2, having pores in the ceramic green sheet, said pores having a total volume in a range of 0.02 to 0.2 $cm^3/g$.

22. A ceramic green sheet according to claim 1 or 2, having pores in the ceramic green sheet, said pores having an average pore size after heat treatment of 100 to 1000 nm and a total volume of 0.04 to 0.2 $cm^3/g$.

23. A ceramic green sheet according to claim 1 or 2, having the following properties after a heat treatment at 80 to 100° C.:

a thickness of 50 µm or more, and pores in the ceramic green sheet, said pores having an average pore size in a portion from a surface to a depth of 10 µm in a range of 100 to 1000 nm and a pore volume in a range of 0.04 to 0.2 $cm^3/g$.

24. A ceramic green sheet according to claim 1 or 2, having pores in the ceramic green sheet said pores having an average pore size after exposure to ultraviolet light in a range of 100 to 1000 nm and a pore volume in a range of 0.04 to 0.2 $cm^3/g$.

25. A ceramic green sheet according to claim 1 or 2, having a glossiness on the surface of the ceramic green sheet of 70% or less.

26. A ceramic green sheet according to claim 1 or 2, having an average surface roughness of 1 µm or less.

27. A ceramic green sheet according to claim 1 or 2, having an average surface roughness of 1 µm or less after a heat treatment.

28. A photosensitive ceramic green sheet according to claim 1 or 2, for a package board for mounting a semiconductor integrated circuit and crystal oscillator.

29. A photosensitive ceramic green sheet according to claim 1, having the following properties before firing:

a thickness of 20 to 600 µm and through holes with a diameter of 20 to 200 µm formed at a 30 to 250 µm pitch in a through hole pattern area.

30. The photosensitive ceramic green sheet according to claim 1, wherein the inorganic powder further comprises 70 wt % or less of a powder of at least one inorganic filler.

31. A ceramic green sheet as defined in claim 1 with a pattern formed on it, comprising:

a circuit wiring pattern having a thickness of 10 to 100 µm before firing, wherein widths of densest lines and spaces of the circuit wiring pattern are 10 to 100 µm and 10 to 500 µm respectively.

32. A process for producing a ceramic green sheet as defined in claim 1 with a pattern formed on it, comprising:

(1) forming the ceramic green sheet from the inorganic powder and the photosensitive organic component, (2) exposing the ceramic green sheet to irradiation to ultraviolet light that has passed through a first mask pattern (3) developing the ceramic green sheet (4) forming through holes, and (5) forming a circuit wiring pattern on the ceramic green sheet by a method selected from the group consisting of method (a) and method (b), wherein method (a) is applying a photosensitive conductive paste comprising a conductive powder and a photosensitive resin composition on the ceramic green sheet, exposing the photosensitive conductive paste through a second mask pattern and developing the exposed photosensitive conductive paste; and method (b) is applying a photosensitive paste comprising a conductive powder and a photosensitive composition on a film surface, exposing the photosensitive conductive paste through a second mask pattern, developing the exposed photosensitive conductive paste to form a circuit wiring pattern and transferring the circuit wiring pattern onto the ceramic green sheet.

33. A process for producing a ceramic green sheet with a pattern formed on it as defined in claim 32, wherein the through holes are formed simultaneously from both sides of the ceramic green sheet or sequentially on each side.

34. A process for producing a ceramic green sheet with a pattern formed on it as defined in claim 32, wherein the through holes are formed by warm bath development in a temperature range of 25 to 50° C.

35. A process for producing a ceramic green sheet with a pattern formed on it as defined in claim 32, wherein the photosensitive conductive paste is filled into the through holes while being applied to the surface of the sheet and the circuit wiring pattern is formed by exposing the photosensitive conductive paste to ultraviolet light and subsequently developing the photosensitive conductive paste.

36. A process for producing a ceramic green sheet with a pattern formed on it as defined in claim 32, wherein the circuit wiring pattern on the ceramic green sheet is formed by the method (b).

37. A process for producing a ceramic green sheet with a pattern formed on it as defined in claims 36, wherein a peeling strength of the film surface is 3 to 7 N/24 mm.

38. A process for producing a ceramic green sheet with a pattern formed on it as defined in claim 36, wherein the film surface is coated with a releasing agent before applying the photosensitive paste.

39. A process for producing a ceramic green sheet as defined in claim 1 with a pattern formed on it, comprising:

coating a surface of the ceramic green sheet with a photosensitive paste comprising an inorganic powder, a photosensitive organic component and a solvent, wherein the solvent does not dissolve the ceramic green sheet.

40. A process for producing a ceramic green sheet with a pattern formed on it according to claim 39, wherein the solvent is at least one solvent selected from ketones, lower alcohols, fatty acid higher alcohol esters and hydrocarbons.

* * * * *